Oct. 18, 1966 H. MARTIN 3,280,389

FREELY EXPANDING PRESSURE MOUNTED SEMICONDUCTOR DEVICE

Filed Aug. 1, 1962 2 Sheets-Sheet 1

United States Patent Office 3,280,389
Patented Oct. 18, 1966

3,280,389

FREELY EXPANDING PRESSURE MOUNTED SEMICONDUCTOR DEVICE

Heinz Martin, Munich, Germany, assignor to Siemens-Schuckertwerke Aktiengesellschaft, Berlin, Germany, a corporation of Germany Filed Aug. 1, 1962, Ser. No. 214,076
Claims priority, application Germany, Aug. 4, 1961, S 75,181
24 Claims. (Cl. 317—234)

My invention relates to improvements in electronic semiconductor devices, preferably having a monocrystalline semiconductor body of germanium, silicon or intermetallic semiconductor compounds, and containing one or more doped zones of respectively different type of electric conductance, thus forming one or more p-n junctions.

It is an object of my invention to provide industrial semiconductor devices having a good and reliably permanent thermal connection between the semiconductor member proper and a housing portion which encloses the semiconductor member or a carrier or heat sink immediately adjacent to the semiconductor member, and which prevents shearing tensions at the connecting location that may otherwise arise as a result of thermal stresses.

To this end, and in accordance with a feature of my invention, I fasten two massive plate-shaped reinforcing bodies to the respective opposite sides of a semiconductor member, after this member is otherwise completed by alloying of electrodes into its two surfaces or by diffusing suitable dopant substances into the semiconductor body and providing the doped zones of the body with suitable connecting electrodes. The plate-shaped reinforcing bodies thus fastened to the respective electrode surfaces of the semiconductor member consist of molybdenum, tungsten or tantalum, or other metal whose thermal coefficient of expansion is as close as feasible to that of the semiconductor material, such as germanium or silicon, being used. The resulting semiconductor member together with the two reinforcing bodies firmly joined therewith is arranged as an insert in a housing which comprises an insulating ring that surrounds the semiconductor member, and two cover plates coaxially located on opposite sides of the insulating ring and having their respective marginal, peripheral zones gas-tightly fastened and sealed to the insulating ring. The reinforcing bodies of the inserted semiconductor member are thus located in face-to-face relation to the two cover plates and are capable of lateral gliding displacement relative thereto when the cover plates are in unstressed condition. The cover plates preferably consist of a ductile material, such as copper or silver. The housing is further provided with stop means which limit the lateral displacement of the semiconductor member to a central area within the inner opening of the insulating ring. These stop means, according to another feature of my invention, consist of protuberances or bulges formed by the cover plates so that the plates themselves, by virtue of their cross-sectional shape, limit the available lateral displacement of the semiconductor member.

In such an assembly according to the invention, the two cover plates place their respective inner surfaces only in loose contact against the respective surfaces of the reinforcing bodies that are joined with the crystalline semiconductor body proper to a single mechanical unit. That is, after the assembly is prepared up to the point described so far, there is no rigid connection between the cover plates and the inserted semiconductor unit, in contrast to the completely rigid bond produced in known devices by an intermediate layer of solder. Consequently, an assembly designed according to the invention and in the condition described above is not yet ready for operation but requires supplementation by a suitable carrier device or by being built together with further components in order to produce an apparatus as required for normal operation in actual practice.

According to another feature of my invention, the above-mentioned cover plates of the housing structure consist of silver sheet material and have one or more bulges protruding into the interior of the enclosed housing space for the purposee of limiting any displacement of the inserted semiconductor member. Such a protuberance of a cover sheet may engage into a recess of the adjacent reinforcing body of the semiconductor member. It is preferable, however, to give the protuberance of the cover sheet the shape of a circular, square or rectangular bulge which is adapted to the perimetric shape of the reinforcing body on the semiconductor member, the bulging protuberance being located between the inner perimeter of the ring-shaped insulating member and the outer perimeter of the reinforcing body. The insulating ring thus forms essentially a frame, and the inserted semiconductor member is restrained by the bulges of the cover plates from being displaced beyond a certain central area of the frame space.

For use of such a semiconductor device in practice, the above-described housing structure is inserted between two carrier plates of a clamping apparatus which acts upon the two cover plates thus establishing in electrical as well as in thermal respects a reliable conducting connection from the encapsulated semiconductor member through the cover plates to the adjacent structural components, terminals or connectors.

The invention is applicable in form of an individual semiconductor device within the clamping apparatus or also with a stack of semiconductor devices of identical design mounted within the clamping apparatus. To this purpose, and in accordance with another feature of my invention, the ring-shaped insulating body that forms part of the housing for the semiconductor member is preferably engageable on its outer periphery with the corresponding frame, or clamping apparatus, or with guiding rods for securing all individual semiconductor devices of the stack in the proper position. The individual semiconductor devices may be equipped with cooling vanes connecting the external surfaces of the respective cover plates on the housings. These vanes can be given recesses or bores for securing the desired mutual positioning of the individual components in the stack. The ends of the stack can be formed by cover plates or terminal bodies which permit mounting the stack on a particular carrier or supporting structure, or combining this stack with one or more other stacks, thus forming a single structural unit of dry rectifiers composed of a multiple stack system. In such composite systems, a plurality of stacks may have cooling plates or vanes in common. Pressure bodies may be inserted between the individual semiconductor devices in the stack.

According to another feature of my invention, relating to a stack of the types mentioned above, the provision of cooling vanes is not limited to those contacting the housing of a semiconductor device, but additional cooling vanes are also built together with the pressure-transmitting bodies disposed between each two adjacent semiconductor devices. In this manner, the heat dissipation from the semiconductor devices to the ambient air or to a flowing cooling medium is further increased.

The above-mentioned and other objects, advantages and features of my invention, said features being set forth with particularity in the claims annexed hereto, will be apparent from, and will be described in, the following with reference to embodiments of semiconductor devices according to the invention illustrated by way of example on the accompanying drawings in which:

Figure 1:
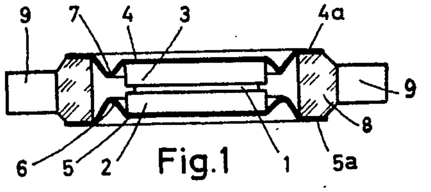
FIG. 1 is a sectional view and FIG. 2 a plan view of an encapsuled rectifier.
Figure 2:
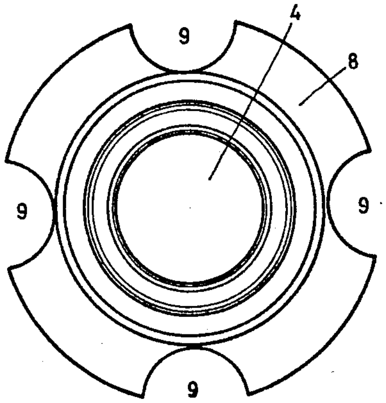

In FIGS. 1 and 2 a circular semiconductor plate 1 is provided with two reinforcing plates 2 and 3. The semiconductor plate 1 proper consists of a circular diode on the basis of a monocrystalline semiconductor body of silicon into whose opposite broad surfaces respective electrode materials are alloyed, these electrodes containing the doping substances necessary to produce in the semiconductor crystal a p-n junction. The reinforcing plates 2 and 3 consist of molybdenum whose thermal coefficient of expansion is substantially equal to that of silicon in sufficient approximation to prevent appreciable mechanical tension from occurring during changes in temperature that are expected in the normal operation of the rectifier device. The plates 2 and 3 are preferably joined with the semiconductor body 1 by the same alloying process that is used for joining the electrode coatings with a silicon body and thereby doping the silicon in the above-described manner.

The semiconductor member 1 with its reinforcing plates 2 and 3 is mounted between two cover plates 4 and 5 which form part of a capsule or housing. The cover plates consist of ductile material and are preferably made of sheet silver. The cover plates are provided with ring-shaped embossments or grooves 6 and 7 which surround the semiconductor member and virtually secure it in proper position. The marginal zones 4*a* and 5*a* of the respective cover plates 3 and 4 are gas-tightly joined by a solder junction with an insulating ring-shaped body 8 consisting of ceramic material or glass. The mechanical connection and gas-tight seal may also be produced by any other suitable fusion junction. The ceramic body 8 is provided with recesses 9 distributed over its periphery and angularly displaced from each other.

The enclosed semiconductor member composed of parts 1, 2, 3 is thus loosely mounted between the two cover plates 4 and 5 of the housing so that it can glide relative to the surfaces of the respective cover plates 4, 5 that face the interior of the housing. In the assembled condition shown in FIGS. 1 and 2, the encapsuled semiconductor device is not yet in operative condition because a sufficient contact between each plate 2, 3 and the adjacent cover plates 5 and 4 respectively is not yet established.

For use, one or more of the encapsuled semiconductor devices are stacked between two carrier plates of a clamping apparatus. The latter acts upon the two cover plates to establish reliable electrical as well as thermal conducting connections from the encapsuled device or devices through the cover plates to the adjacent structural components, terminals, or connectors. This clamping apparatus, however, must satisfy the condition that its surfaces facing the copper plates of the semiconductor housing structure are moved toward each other in parallel guidance so that no undesired mechanical edging of the semiconductor member enclosed in the housing can take place. It is desirable for this purpose that the surfaces facing each other between the semiconductor member and the cover plates within the housing are of best feasible accuracy with respect to being parallel to each other.

It is therefore preferable to grind or lap these surfaces. In order also to have the surfaces of the clamping device that mechanically acts upon the encapsulated semiconductor device guided by maintaining an accurately parallel relation to each other, it is preferable to provide a particular guiding equipment in order to secure the desired guiding accuracy of the clamping components.

According to another feature of my invention, the heat dissipation from the semiconductor member to the environment is improved by providing additional radiator vanes and clamping them together with the external surfaces of the cover plates, simultaneously with the above-described mounting and clamping of the encapsuled semiconductor device.

Figures 3, 3A:
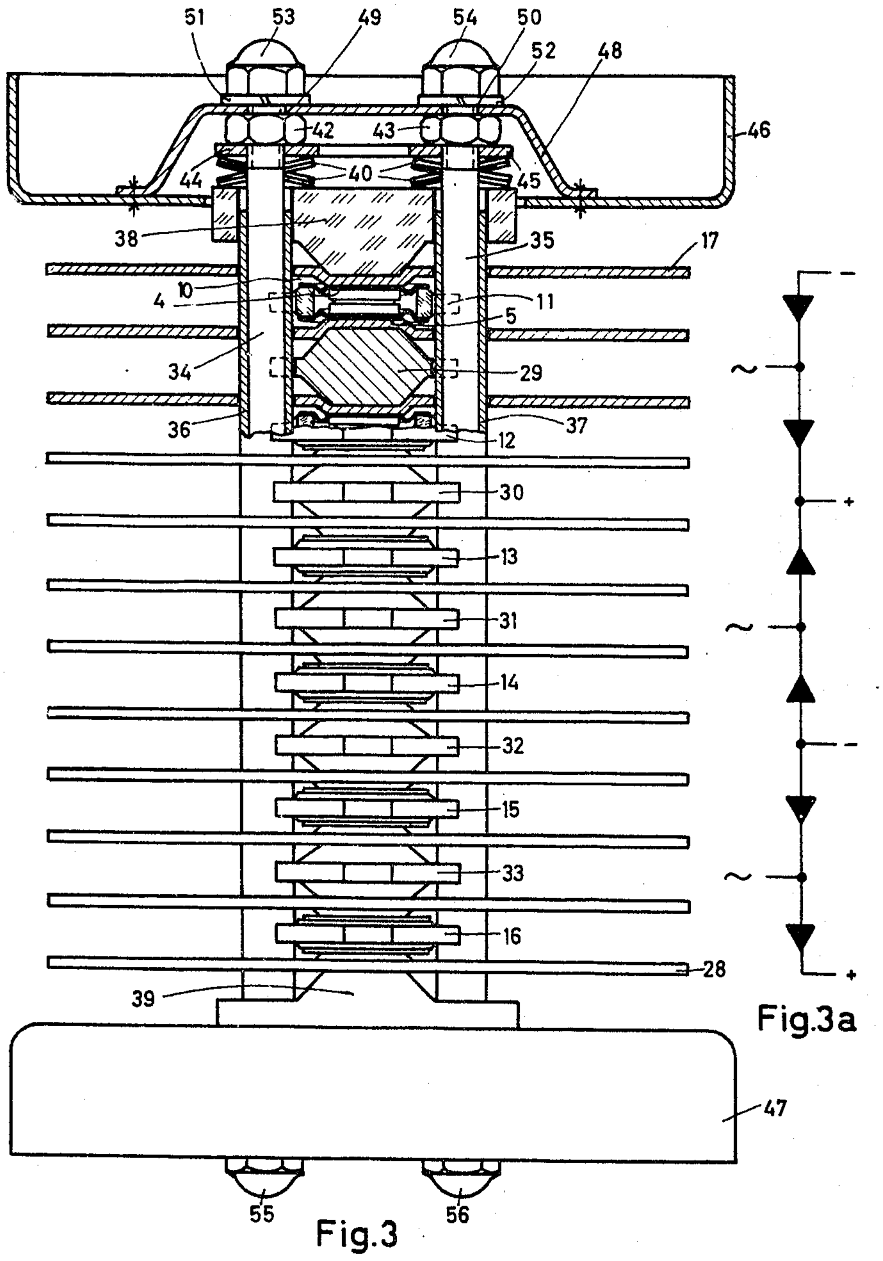
FIG. 3 shows, partly in section, a rectifier system comprising a stack of individual rectifiers according to FIGS. 1 and 2.
FIG. 3a is a schematic circuit diagram of the same system.

The embodiment shown in FIG. 3 exemplifies how a number of semiconductor members designed in accordance with FIGS. 1 and 2 can be assembled into a stack system. In the embodiment of FIG. 3 the stack constitutes a three-phase rectifier bridge network in accordance with the schematic circuit diagram of FIG. 3*a*.

The stack system comprises six semiconductor members 11 to 16. Adjacent to the cover plates 4, 5 of each of these semiconductor members is a cooling plate or vane, denoted 17 to 28, whose center portion is provided with a cup-shaped recess. The bottom of the recessed vane portion is placed against one of the cover plates 4 or 5 of one of the respective rectifier members 11 to 16. One of a series of pressure bodies 29 to 33 is interposed between each two cooling vanes that are not separated by one of the rectifier devices.

Figure 4:
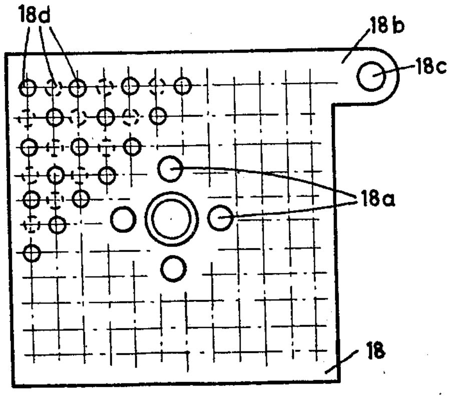
FIG. 4 is a plan view and FIG. 5 a cross section of a cooling plate applicable in a rectifier stack otherwise corresponding to FIG. 3.
Figure 5:
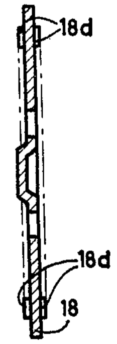

The cooling vanes are provided with bores 18*a* as is shown for the cooling vane 18 in FIGS. 4 and 5. By virtue of these bores 18*a* and the above-mentioned lateral recesses 9 in the insulating rings 8 of the rectifier members, in conjunction with corresponding recesses on the periphery of the pressure bodies 29 to 33, these components can be aligned on rods 34 and 35 of a frame structure. The rods 34 and 35 consist preferably of structural steel, and are provided with insulating sleeves 36 and 37 respectively. Located at the ends of the stack are respective pressure bodies 38 and 39 whose exterior surfaces are acted upon by disc-type springs 40 of arcuate cross section. These springs can be tightened by means of respective pressure plates 44, 45 and nuts 42, 43 which fasten upon the rods 34, 35 respectively. The frame structure of the stack further comprises cup-shaped bodies 46 and 47 having respective interior bottoms joined by welding with the rim of a pan-shaped bridge structure 48. The pan-shaped structure 48 is provided with bores 49 and 50 by means of which the structure 48 is pushed upon the rods 34 and 35, whereafter it is fastened by means of lock washers 51, 52 and cup-shaped nuts 53, 54 and 55, 56. With the aid of the mounting structures 46 and 47, the stack can be attached to a carrier, for example to the frame of a rectifier plant. As is apparent from FIG. 4, the individual cooling vane can be provided with protruding terminal portion 18*b* with a bore 18*c* for attachment of an electric terminal or other electric connection.

The cooling vane according to FIGS. 4 and 5 is provided with bosses 18*d* or other protruding portions, produced by pressing, which, in the assembled condition of the cooling vanes, provide interstitial spaces to be traversed by air or other fluid coolant. The bosses, ledges or other protruding parts of the vanes then also take care of producing a whirling or turbulent flow of the coolant, thus improving the cooling action.

In accordance with still another feature of my invention, simplification and improved reliability are afforded by subjecting the individual semiconductor housing from one side to a pressure body which has a planar surface facing the semiconductor device, whereas the opposite surface of the pressure body has spherical shape and cooperates through the latter surface with a pan or socket recess of another body appertaining to the clamping device. As a result, the assembly comprising the individual semiconductor device and the two clamping plates, having outwardly spherical surfaces, can adapt itself in the spherical recess. As a result, the occurrence of any mechanical stresses that may cause undesired tensions in the encapsulated semiconductor member is prevented, and a good mutual contact is secured at the heat-transfer surfaces between the semiconductor device and its cover plates, on the one hand, and the adjacent parts of the clamping device, on the other hand, so that the electric current path as well as the path of heat dissipation exhibit highest feasible quality.

Vanes on the cover plates and semiconductor devices can readily be employed conjointly with the above-mentioned spherical adapting surfaces for preventing the encapsulated semiconductor member from being subjected to undesired mechanical stresses due to the action of the clamping device.

Figure 6:
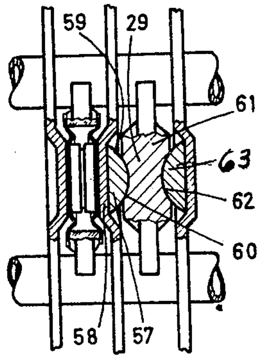
FIG. 6 is a partial and sectional view of another stack of rectifiers according to the invention.

A structure utilizing these principles is shown in FIG. 6 in conjunction with a stack of housings.

The modified stack of rectifiers partially illustrated in FIG. 6 differs from that of FIG. 3 substantially by the structure of its pressure bodies instead of those denoted by 29 to 33 in FIG. 3. According to FIG. 6, the cooling vane adjacent to a semiconductor member according to FIGS. 1 and 2 is contacted by a pressure body 57 which has a planar surface in contact with the cooling vane but whose opposite surface 59 is either completely or partially of spherical shape. In the illustrated embodiment the entire surface portion of the pressure body 57 bordering the planar surface 58 is spherical. Instead, only the central portion may be given a spherical outer surface. If desired, a hollow pressure body may also be used whose inner edge, at one axial end of the hollow body, cooperates with a portion of spherical shape or also with a portion of conical shape if only small corrections in adjustment are to be taken into account. The partly spherical pressure body 59 engages with its spherical portion a corresponding concave socket 60 of another pressure body 61. The body 61 possesses on its opposite side a symmetrical spherical socket 62 which cooperates with a convex spherical portion of a second pressure body in face-to-face contact with the cooling vane adjacent to another semiconductor device. Each of the two pressure bodies may also act directly upon respective cover plates of two semiconductor devices if the stack is not equipped with cooling vanes at these localities.

In a rectifier stack as exemplified by FIG. 6, each individual subassembly comprising a complete semiconductor device of components 1 to 9 (FIGS. 1, 2) plus the adjacent cooling vanes 58 and the adjacent pressure bodies 59 and 63 can adapt itself between the spherical sockets of two pressure bodies corresponding to those denoted by 61 so as always to have the proper alignment while securing a good mutual contact between the pressure bodies, cooling vanes and the exterior surfaces of the cover plates appertaining to the individual semiconductor members. As a result, undesired edging or tension at the semiconductor members is definitely obviated and each member is subjected to a pure pressure force between the cover plates 2 and 3.

Figure 7:
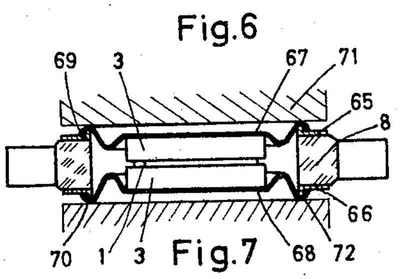
FIGS. 7 and 8 are respective sectional views of modified embodiments of encapsulated semiconductor devices largely similar to that of FIGS. 1 and 2.

FIG. 7 illustrates a different individual semiconductor member or element according to the invention. In this embodiment the mutual tight connection and seal between the cover plates 4, 5 and the insulating ring 8 is produced by soldering, but care is taken that the solder material cannot enter into the enclosed chamber within the housing in which the semiconductor body proper is inserted. Before assembling the insulating ring 8 with the cover plates, two ring-shaped metal bodies of angular cross section are coaxially joined with the insulating ring, for example by soldering them to a metallized surface portion of the ring. Thereafter, the two cover parts 67 and 68 are placed upon the metal rings 65 and 66 respectively, and the edges of the circular cover plates are clamped fast on the protruding portions of the rings. The clamping of the cover plates 67 and 68 upon the protruding rim portions 69 and 70 of the rings 65 and 66 respectively can be effected with the aid of two pressure plates 71 and 72 which are forced against each other and against the cover plates to the position shown in FIG. 7. Thereafter, the solder junction between the parts 65 and 67, on the one hand, and between the parts 66 and 70, on the other hand, is effected, the soldering being done in the angle space of the rings 65 and 66. Due to the mutual pressure force between parts 67 and 69 and between parts 68 and 70, no liquid solder can reach the enclosed chamber during the soldering operation, and for the same reason no vapors of the solder material can reach this enclosed space. If desired, the localities adjacent to the solder joint to be produced can be coated with varnish to help prevent solder material from migrating into the chamber space.

The ring-shaped insulating body of the housing may also serve as a means for increasing the creeping-current paths to a desired extent. For this purpose, the portion of the insulating ring-shaped body protruding beyond the extent of the cover plates can be extended in the planar direction of the cover plates or can additionally be given a particular cross-sectional shape so that not only an extension of the creepage distance in the mentioned plane but also perpendicular to that plane is obtained.

A force-storing member, for example in form of one or more springs, can be inserted in a stack system according to FIG. 6 between the two pressure pieces 59, 63 that have respective spherical surfaces facing away from a rectifier device. The inserted force-storing springs are preferably mounted so that their end faces abut against the pressure plates 59, 63 in such a manner as to be secured from undesired displacements relative to the pressure pieces. For example, the spring members may consist of disc-type springs of arcuate cross section corresponding to those shown at 40 in FIG. 3, and these springs may engage protruding bosses or enter into recesses of the just mentioned pressure pieces.

Figure 8:
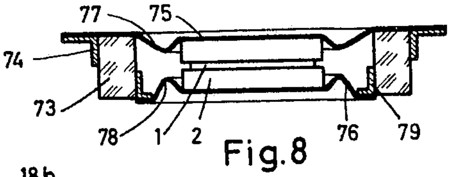

In the embodiment of FIG. 8 the two cover plates differ from each other in contrast to the uniform design employed in the device of FIGS. 1 and 2. The insulated ring 73 which forms part of the housing carries on its outer periphery a metal ring 74 of angular cross section which is fastened and gas-tightly sealed to the insulating ring by hard soldering. The marginal zone of a cover plate 75 of ductile material, preferably silver, is fastened and sealed to the metal ring 74, for example by soldering or electric resistance welding. The second ductile cover plate 76, preferably of silver, is fastened to another metal ring 79 of angular cross section which is secured and sealed to the insulating ring 73, for example by hard soldering, it being understood that the insulating ring is preferably provided with metallized coatings at those localities where the metal rings 74 and 79 are to be fastened. The cover plate 76 has its marginal zone sealed and fastened to the ring 79 by soldering or electric resistance welding. The semiconductor member proper comprises the parts 1, 2 and 3 which are identical with these described above in conjunction with FIGS. 1 and 2. The reinforcing plates 2 and 3 of the member are in glidable face-to-face engagement with the adjacent surfaces of the respective cover plates 75 and 76. The two cover plates 75 and 76 are provided with respective coaxial bulges or grooves 77, 78 in order to hold the semiconductor member substantially in proper position relative to the cover plates when the semiconductor member is not yet assembled with pressure pieces or with other semiconductor members in the above-described manner.

Instead of providing both cover plates with means for securing the semiconductor member in proper position, only one of the cover plates need be equipped with such means.

Referring to the above-described cooperation of pressure pieces which act through spherical surfaces upon the semiconductor members, it should be understood that such a device may be modified so that a pressure piece acts through a spring body with a spherical outer jacket surface upon the cover plates of the housing. Such an intermediate pressure piece can be constituted by a disc-type spring which has its convex surface facing the semiconductor device.

A stack system of semiconductor rectifier members according to the invention can further have the pressure between the units of the stack produced by a single pressure screw through a pressure piece acting, preferably over a system of spherical surfaces as described above, upon the other components of the stack. This pressure screw is preferably arranged in a yoke plate mounted on four parallel rods according to those denoted by 34 and 35 in FIG. 3, between which the semiconductor members and intermediate pressure pieces are stacked, the yoke plates being acted upon by four helical springs placed upon the above-mentioned four rods respectively of the frame structure. The provision of the cooling vanes or plates with four openings (FIG. 4) by means of which they are stuck upon four rods of the frame structure has the advantage that these plates, equipped with corresponding terminal members such as shown at **18*b*** in FIG. 4, can be given different respective positions of the terminal members, so that the respective terminals of serially adjacent cooling plates are angularly displaced from each other along the stack.

According to the invention the pressure bodies inserted between two adjacent semiconductor devices of a stack are either made of metal, if this is required for completing corresponding electric circuits, or they are made entirely or partially of insulating material, for example by insertion of intermediate insulating plates, in cases where these pressure bodies must provide for electric insulation of the two adjacent semiconductor or rectifier members in the stack. As noted, the entire stack is preferably clamped together with the aid of an inserted force-storing device in order to take care of a reliable mutual engagement between the components of the stack, without introducing undesired mechanical tensions, regardless of changes in operating temperature and changes in ambient temperature. The above-mentioned cooling vanes can also be used, if desired, for the purpose of electrically connecting the individual stacks or component elements thereof, for example for the purpose of connecting the members of a stack so as to form a single-phase or multi-phase electrical bridge network of rectifiers. For this purpose the vanes are preferably provided with suitable extensions to which the necessary wires or other conductors can be attached, for example by means of terminal screws.

The above-mentioned force-storing devices inserted into the system of the stack, are preferably so enclosed as to be protected from soiling which may otherwise impair the performance of the individual force storers.

Semiconductor devices have been known wherein a semiconductor diode was located within a housing comprising an insulating ring joined with metallic cover bodies shaped as a ring or a wavy diaphragm and having a simple portion connected electrically as well as mechanically with the semiconductor member located between the cover bodies. However, these cover plates served the purpose of acting as springs or spring diaphragms so that the individual semiconductor device was capable of normal operation by virtue of the elastic contact made and preserved by the cover plates. The necessity of providing for such spring action makes it necessary to make the cover bodies in the known device of a corresponding mechanically stable material, suitable to provide for the necessary elasticity. This excludes the use of ductile materials such as silver or copper as are desirable for the purposes of the present invention. Furthermore, since in the known devices the connection between the cover bodies and the semiconductor member is substantially rigid in mechanical respects, appreciable mechanical shearing tensions may occur and may result in impairment of the semiconductor member, due to the fact that the materials of the semiconductor member and the adjacent housing components exhibit respectively different amounts of elongation and contraction under the different temperatures to which the semiconductor member is subjected when in operation.

Such mechanical stresses cannot possibly occur in a semiconductor device according to the invention because the enclosed semiconductor member is in glidable contact with the inner surfaces of the cover plates. Furthermore, in a device according to the invention, care can be taken that the materials that are thus glidingly in contact with each other are substantially different in the sense required to prevent freezing of the adjacent bodies at their places of engagement, such freezing being virtually equivalent to a mechanically rigid connection, for example as established by soldering. Thus, as mentioned, it is preferable to make the cover plates of the housing of a ductile material such as silver, whereas the adjacent surface of the reinforcing plate on the semiconductor member consists of molybdenum, tantalum or tungsten. While other metals can be employed for the cover plates as well as the reinforcing plates, it is important for the purposes of the invention to have the enclosed semiconductor element in face-to-face contact with a material of a different thermal coefficient of expansion at a surface that substantially permits only a glidable mutual pressure contact rather than a freezing contact, thus excluding the possibility of undesired shearing stresses due to thermal changes.

Such and various other modifications will be obvious to those skilled in the art, upon a study of this disclosure, and are readily applicable without departing from the essential features of my invention and within the scope of the claims annexed hereto.

I claim:

1. A semiconductor device comprising a semiconductor member having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing having an insulating ring spaced from and surrounding said semiconductor member and having resilient top and bottom cover plates of metal whose respective rim portions are joined and sealed to said ring on opposite sides thereof; said semiconductor member being inserted between said two cover plates in fact-to-face continuous relation thereto and capable of lateral gliding motion relative thereto when said cover plates are unstressed, and said plates having stop means for limiting lateral displacements of said semiconductor member.

2. A semiconductor device comprising a semiconductor member having a body of monocrystalline semiconductor material with a p-n junction and integrally joined electrodes on respective opposite sides and having two reinforcing bodies alloy-bonded to said respective electrodes in face-to-face relation thereto, said reinforcing bodies being formed of metal from the group consisting of molybdenum, tungsten and tantalum; a housing having an insulating ring spaced from and surrounding said semiconductor member and having resilient top and bottom cover plates consisting of good conductive metal of higher ductility than that of said reinforcing bodies, said cover plates having respective rim portions joined and sealed to said ring on opposite sides thereof; said semiconductor member being inserted between said two cover plates in face-to-face contiguity therewith and capable of lateral gliding motion relative thereto when said cover plates are unstressed, and said plates having stop means for limiting lateral displacements of said seminconductor member.

3. In a seminconductor device according to claim 1, said cover plates consisting substantially of silver.

4. A semiconductor device comprising a semiconductor member having a body of monocrystalline semiconductor material with p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing having an insulating ring spaced from and surrounding said semiconductor member and having resilient top and bottom cover plates of metal whose respective rim portions are joined and sealed to said ring on opposite sides thereof; said semiconductor member being inserted between said two cover plates in face-to-face contiguity therewith and capable of lateral gliding motion relative thereto when said cover plates are unstressed; said cover plates having raised portions between said semiconductor member and the inner periphery of said ring, said raised portions forming stop means for limiting lateral displacements of said semiconductor member to a central area within said ring.

5. A semiconductor device comprising a semiconductor member having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing having an insulating ring spaced from and surrounding said semiconductor member and having resilient top and bottom cover plates of metal whose respective rim portions are joined and sealed to said ring on opposite sides thereof; said semiconductor member being inserted between said two cover plates in face-to-face contiguity therewith and capable of lateral gliding motion relative thereto when said cover plates are unstressed; said cover plates each having a bulge protruding inwardly and surrounding said semiconductor element at its periphery, said bulges forming stop means for limiting lateral displacements of said semiconductor member to a central area within said ring.

6. A semiconductor device comprising a semiconductor member having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing having a glass insulating ring spaced from and surrounding said semiconductor member and having resilient top and bottom cover plates of metal in flat engagement with said electrodes; a glass fusion joint joining and sealing the rim portions of said cover plates to said ring on opposite sides thereof; said semiconductor member being inserted between said two cover plates in face-to-face relation thereto and capable of lateral gliding motion relative thereto when said cover plates are unstressed, and said housing having stop means for limiting lateral displacements of said semiconductor member.

7. A semiconductor device comprising a semiconductor member having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing having an insulating ring spaced from and surrounding said semiconductor member and having resilient top and bottom cover plates of metal; a solder joint joining and sealing said rim portions of said cover plates to said ring on opposite sides thereof; said ring comprising ceramic material; said semiconductor member being inserted between said two cover plates in face-to-face contiguity therewith and capable of lateral gliding motion relative thereto when said cover plates are unstressed, and said housing having stop means for limiting lateral displacements of said semiconductor member.

8. A semiconductor device comprising a semiconductor member having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing having an insulating ceramic ring spaced from and surrounding said semiconductor member and having resilient top and bottom cover plates of metal whose respective rim portions are joined and sealed to said ring on opposite sides thereof; said housing having rings of metal fusion-connecting the surface of the ring to be sealed with the cover plates.

9. A semiconductor device comprising a semiconductor member having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing having an insulating ring spaced from and surrounding said semiconductor member and having resilient top and bottom cover plates of metal whose respective rim portions are joined and sealed to said ring on opposite sides thereof; said semiconductor member being inserted between said two cover plates in face-to-face contiguity therewith and capable of lateral gliding motion relative thereto when said cover plates are unstressed, and said housing having stop means for limiting lateral displacements of said semiconductor member; and a holding frame; said insulating means having engagement means on its periphery engageable with said holding frame for securing said semiconductor member in proper position relative to said frame.

10. A semiconductor device comprising a semiconductor member having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing having an insulating ring spaced from and surrounding said semiconductor member and having resilient top and bottom cover plates of metal whose respective rim portions are joined and sealed to said ring on opposite sides thereof; said semiconductor member being inserted between said two cover plates in face-to-face contiguity therewith and capable of lateral gliding motion relative thereto when said cover plates are unstressed, and said housing having stop means for limiting lateral displacements of said semiconductor member; clamping means including respective pressure pieces engaging said cover plates from respectively opposite sides for forcing them against the reinforcing plates thereby establishing and maintaining a contact pressure.

11. A semiconductor device comprising a semiconductor member having a body of crystalline semiconductor material with integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing having an insulating ring surrounding said semiconductor member and having top and bottom cover plates of metal whose respective rim portions are joined and sealed to said ring on opposite sides thereof; said semiconductor member being inserted between said two cover plates in face-to-face relation thereto and capable of lateral gliding motion relative thereto when said cover plates are unstressed, and said housing having stop means for limiting lateral displacements of said semiconductor member; clamping means including respective pressure pieces engaging said cover plates from respectively opposite sides for forcing them against the reinforcing plates thereby establishing and maintaining a contact pressure, said pressure pieces comprising a first member having a planar surface engaging the outer surface of one of said cover plates and having a spherical surface opposite said planar surface, said pressure pieces having another member with a concave surface engaged by the spherical surface of the other members.

12. A semiconductor device comprising a semiconductor member having a body of crystalline semiconductor material with integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing having an insulating ring surrounding said semiconductor member and having top and bottom cover plates of metal whose respective rim portions are joined and sealed to said ring on opposite sides thereof; said semiconductor member being inserted between said two cover plates in face-to-face relation thereto and capable of lateral gliding motion relative thereto when said cover plates are unstressed, and said housing having stop means for limiting lateral displacements of said semiconductor member; clamping means including respective pressure pieces engaging said cover plates from respectively opposite sides for forcing them against the reinforcing plates thereby establishing and maintaining a contact pressure, said pressure pieces comprising a first member having a planar surface engaging the outer surface of one of said cover plates and having a spherical surface opposite the planar surface, said pressure pieces each having another member with a concave surface engaged by the spherical surface of the other members; a cooling vane clamped fast between the cover plate and the pressure piece acting upon said cover plate; said cooling vane protruding laterally beyond the perimeter of the ring.

13. A semiconductor device comprising a plurality of semiconductor members each having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing for each semiconductor member, each housing having an insulating ring spaced from and surrounding said semiconductor member and having resilient top and bottom cover plates of metal whose respective rim portions are joined and sealed to said ring on opposite sides thereof; each of said semiconductor members being inserted between said two cover plates in face-to-face contiguous relation thereto and capable of relative lateral motion relative thereto when said cover plates are unstressed, and said plates having stop means for limiting lateral displacement of said semiconductor members; said housings being aligned to form a stack; a frame structure holding said housings together; a plurality of pressure pieces respectively inserted between mutually adjacent housings; end bodies on said frame structure; and force storing means on said frame structure for holding the stack in compressed condition.

14. A semiconductor device comprising a plurality of semiconductor members each having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing for each semiconductor member, each housing having an insulating ring spaced from and surrounding said semiconductor member and having resilient top and bottom cover plates of metal whose respective rim portions are joined and sealed to said ring on opposite sides thereof; each of said semiconductor members being inserted between said two cover plates in face-to-face contiguous relation thereto and capable of relative lateral motion relative thereto when said cover plates are unstressed, and said housing having stop means for limiting lateral displacement of said semiconductor members; said housings being aligned to form a stack; a frame structure holding said housings together; a plurality of pressure pieces respectively inserted between mutually adjacent housings; end bodies on said frame structure; cooling vanes inserted between said housings and said pressure pieces; and force storing means on said frame structure for holding the stack in compressed condition.

15. A semiconductor device comprising a plurality of semiconductor members each having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing for each semiconductor member, each housing having an insulating ring spaced from and surrounding said semiconductor member and having resilient top and bottom cover plates of metal whose respective rim portions are joined and sealed to said ring on opposite sides thereof; each of said semiconductor members being inserted between said two cover plates in face-to-face contiguous relation thereto and capable of relative lateral motion relative thereto when said cover plates are unstressed, and said housing having stop means for limiting lateral displacement of said semiconductor members; said housings being aligned to form a stack; a frame structure holding said housings together; a plurality of pressure pieces respectively inserted between mutually adjacent housings; end bodies on said frame structure; force storing means on said frame structure for holding the stack in compressed condition; end plates mounted at the ends of said stacks and having means for mounting said stack upon other structures.

16. A semiconductor device comprising a plurality of semiconductor members each having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to thata of said semiconductor material; a housing for each semiconductor member, each housing having an insulating ring spaced from and surrounding said semiconductor member and having resilient top and bottom cover plates of metal whose respective rim portions are joined and sealed to said ring on opposite sides thereof; each of said semiconductor members being inserted between said two cover plates in face-to-face contiguous relation thereto and capable of relative lateral motion relative thereto when said cover plates are unstressed, and said housing having stop means for limiting lateral displacement of said semiconductor members; said housings being aligned to form a stack; a frame structure holding said housings together; a plurality of pressure pieces respectively inserted between mutually adjacent housings; end bodies on said frame structures; force storing means on said frame structure or holding the stack in compressed condition; end plates mounted at the ends of said stacks and having means for mounting said stack upon other structures; cup-shaped terminal structures upon the respective end plates and covering said force storing means to protect said force storing means.

17. A semiconductor device comprising a plurality of semiconductor members each having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing for each semiconductor member, each housing having an insulating ring spaced from and surrounding said semiconductor member and having resilient top and bottom cover plates of metal whose respective rim portions are joined and sealed to said ring on opposite sides thereof; each of said semiconductor members being inserted between said two cover plates in face-to-face contiguous relation thereto and capable of relative lateral motion relative thereto when said cover plates are unstressed, and said housing having stop means for limiting lateral displacement of said semiconductor members; said housings being aligned to form a stack; a frame structure holding said housings together; a plurality of pressure pieces respectively inserted between mutually adjacent housings; end bodies on said frame structure; cooling vanes inserted between said housings and said pressure pieces; and force storing means on said frame structure for holding the stack in compressed condition, said cooling vanes contacting said cover plates and having protruding portions forming electric connecting points.

18. A semiconductor device comprising a plurality of semiconductor members each having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing for each semiconductor member, each housing having an insulating ring spaced from and surrounding said semiconductor member and having resilient top and bottom cover plates of metal whose respective rim portions are joined and sealed to said ring on opposite sides thereof; each of said semiconductor members being inserted between said two cover plates in face-to-face contiguous relation thereto and capable of relative lateral motion relative thereto when said cover plates are unstressed, and said housing having stop means for limiting lateral displacement of said semiconductor members; said housings being aligned to form a stack; a frame structure holding said housings together; a plurality of pressure pieces respectively inserted between mutually adjacent housings; end bodies on said frame structure; cooling vanes inserted between said housings and said pressure pieces; and force storing means on said frame structure for holding the stack in compressed condition; a single one of said housings being provided with a plurality of cooling vanes located beside each other.

19. A semiconductor device comprising a plurality of semiconductor members each having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing for each semiconductor member, each housing having an insulating ring spaced from and surrounding said semiconductor member and having resilient top and bottom cover plates of metal whose respective rim portions are joined and sealed to said ring on opposite sides thereof; each of said semiconductor members being inserted between said two cover plates in face-to face contiguous relation thereto and capable of relative lateral motion relative thereto when said cover plates are unstressed, and said housing having stop means for limiting lateral displacement of said semiconductor members; said housings being aligned to form a stack; a frame structure holding said housings together; cooling vanes inserted between said housings and having simultaneous contact with adjacent housings.

20. A semiconductor device comprising a plurality of semiconductor members each having a body of monocrystalline semiconductor material with a p-n junction integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing for each semiconductor member, each housing having an insulating ring spaced from and surrounding said semiconductor member and having resilient top and bottom cover plates of metal whose respective rim portions are joined and sealed to said ring on opposite sides thereof; each of said semiconductor members being inserted between said two cover plates in face-to-face contiguous relation thereto and capable of relative lateral motion relative thereto when said cover plates are unstressed, and said housing having stop means for limiting lateral displacement of said semiconductor members; said housings being aligned to form a stack; a frame structure holding said housings together; a plurality of pressure pieces respectively inserted between mutually adjacent housings; end bodies on said frame structure; force storing means on said frame structure for holding the stack in compressed condition; said frame structure including parallel rods having insulated surfaces.

21. A semiconductor device comprising a plurality of semiconductor members each having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing for each semiconductor member, each housing having an insulating ring spaced from and surrounding said semiconductor member and having resilient top and bottom cover plates of metal whose respective rim portions are joined and sealed to said ring on opposite sides thereof; each of said semiconductor members being inserted between said two cover plates in face-to-face contiguous relation thereto and capable of relative lateral motion relative thereto when said cover plates are unstressed, and said housing having stop means for limiting lateral displacement of said semiconductor members; said housings being aligned to form a stack; a frame structure holding said housings together; a plurality of pressure pieces respectively inserted between mutually adjacent housings; end bodies on said frame structure; cooling vanes inserted between said housings and said pressure pieces; and force storing means on said frame structure for holding the stack in compressed condition;

said cooling vanes having embossments forming whirl-producing obstacles for fluid coolant.

22. A device as in claim 21 wherein said ring protrudes beyond the cover plates and determines an extended path for creep currents.

23. A semiconductor device comprising a semiconductor member having a body of monocrystalline semiconductor material with a p-n junction and integrally joined electrodes on respective opposite sides and having two reinforcing bodies alloy-bonded to said respective electrodes in face-to-face relation thereto, said reinforcing bodies consisting of metal having a thermal coefficient of expansion approximately equal to that of said semiconductor material; a housing having an insulating ceramic ring spaced from and surrounding said semiconductor member and having resilient top and bottom cover plates of metal whose respective rim portions are joined and sealed to said ring on opposite sides thereof; said housing having rings of metal fusion-connecting the surface of the ring to be sealed with the cover plates, said rings having an angular cross section; said cover plates having rim portions firmly pressed upon the rims of said metal rings and being fastened thereto and sealed by a solder joint in the angular zone of the metal ring.

24. A semiconductor device comprising a semiconductor member having a body of monocrystalline semiconductor material with a p-n junction and integrally joined electrodes on respective opposite sides and having two reinforcing bodies alloy-bonded to said respective electrodes in face-to-face relation thereto, said reinforcing bodies being formed of metal from the group consisting of molybdenum, tungsten and tantalum; a housing having an insulating ring spaced from and surrounding said semiconductor member and having resilient top and bottom cover plates consisting of silver; said cover plates having respective rim portions joined and sealed to said ring on opposite sides thereof; said semiconductor member being inserted between said two cover plates in face-to-face contiguous relation thereto and capable of later gliding motion relative thereto when said cover plates are unstressed, and said housing having stop means for limiting lateral displacements of said semiconductor member.

References Cited by the Examiner

UNITED STATES PATENTS

| | | | |
|---|---|---|---|
| 2,792,537 | 5/1957 | Martin | 317—234 |
| 2,815,472 | 12/1957 | Jackson | 317—235 |
| 2,839,710 | 6/1958 | Doucot | 317—234 |
| 2,899,610 | 8/1959 | Van Amstel. | |
| 3,047,780 | 7/1962 | Metz | 317—234 |

JOHN W. HUCKERT, *Primary Examiner.*

DAVID J. GALVIN, *Examiner.*

J. A. ATKINS, J. D. KALLAM, *Assistant Examiners.*